(12) United States Patent
Coudurier

(10) Patent No.: US 7,566,472 B2
(45) Date of Patent: Jul. 28, 2009

(54) EASY-TO-CLEAN COOKING SURFACE AND ELECTRIC HOUSEHOLD APPLIANCE COMPRISING SAME

(75) Inventor: Alain Coudurier, Albens (FR)

(73) Assignee: SEB S.A., Ecully (FR)

( * ) Notice: Subject to any disclaimer, the term of this patent is extended or adjusted under 35 U.S.C. 154(b) by 406 days.

(21) Appl. No.: 10/570,202

(22) PCT Filed: Sep. 2, 2004

(86) PCT No.: PCT/FR2004/002244

§ 371 (c)(1),
(2), (4) Date: Mar. 2, 2006

(87) PCT Pub. No.: WO2005/025394

PCT Pub. Date: Mar. 24, 2005

(65) Prior Publication Data

US 2006/0278212 A1 Dec. 14, 2006

(30) Foreign Application Priority Data

Sep. 11, 2003 (FR) .................................. 03 10679

(51) Int. Cl.
*A23L 1/00* (2006.01)
*A47J 36/02* (2006.01)

(52) U.S. Cl. ....................... 426/523; 99/422; 220/573.1; 204/298.13; 29/527.2

(58) Field of Classification Search ....................... None
See application file for complete search history.

(56) References Cited

U.S. PATENT DOCUMENTS

| 2,057,254 A | | 10/1936 | Sommer |
| 2,771,360 A | * | 11/1956 | Malcolm ..................... 420/436 |
| 3,433,631 A | * | 3/1969 | Frank et al. ................. 420/436 |
| 3,460,523 A | | 8/1969 | Stiles et al. |
| 3,547,098 A | | 12/1970 | Lee |
| 3,865,858 A | * | 2/1975 | Rademacher ............... 420/436 |
| 3,993,597 A | | 11/1976 | Stiles |
| 4,191,791 A | * | 3/1980 | Lyons ........................ 427/455 |
| 6,797,137 B2 | * | 9/2004 | Sandlin et al. ......... 204/298.13 |
| 2008/0081211 A1 | * | 4/2008 | Tuffe et al. ................. 428/650 |

FOREIGN PATENT DOCUMENTS

| CH | 516 006 A | | 11/1971 |
| EP | 0 440 877 A | | 8/1991 |
| GB | 220 710 A | | 8/1924 |
| JP | 62-263803 | * | 11/1987 |
| JP | 11-077375 | * | 3/1999 |

* cited by examiner

*Primary Examiner*—John J Zimmerman
(74) *Attorney, Agent, or Firm*—Browdy and Neimark, P.L.L.C.

(57) ABSTRACT

The invention relates to a food cooking surface for kitchen utensils or cooking appliances. The invention is characterised in that the cooking surface is a metallic compound containing, by weight, at least 50% cobalt and at least 18% chrome. Advantageously, the compound comprises at least 5% of one or more metals from tungsten, nickel and molybdenum.

5 Claims, No Drawings

EASY-TO-CLEAN COOKING SURFACE AND ELECTRIC HOUSEHOLD APPLIANCE COMPRISING SAME

The present invention relates to the field of articles intended for the preparation and cooking of food and more particularly the cooking surface of these articles in contact with food to be prepared.

For many years, significant efforts have been made to facilitate the daily preparation of meals. Among notable progress, coatings based on fluorocarbonated polymers as an adhesive coating in kitchen utensils have rapidly developed since the end of the 1950's. Such coatings are universally known since the process presented in the patent FR 1120749 allowed a secure fixing of such coatings on various metals, such as aluminum.

However, such coatings remain fragile. Thus, ways were developed in order to mechanically reinforce the layer on its support. Many improvement patents describe methods and means making it possible to increase the scratch resistance of such coatings, by acting on the coating and/or the substrate. Despite everything, such coatings remain sensitive to the repeated use of sharpened or pointed metallic materials, such as knives or forks.

In parallel, developments have been carried out on mechanically resistant surfaces, for which it was attempted to improve the ease of cleaning. Metal deposits, such as chromium plating on stainless steel, quasi-crystals, or nonmetals (silicates . . . ) thus appeared. The results remain however disappointing, in particular in comparison with coatings of the PTFE type.

The present invention aims at remedying the above mentioned disadvantages of the prior art, by proposing a cooking surface with improved characteristics of ease of cleaning, of corrosion resistance, while having a good mechanical quality.

The present invention is achieved by a food cooking surface for a kitchen utensil or cooking appliance, characterized in that this cooking surface is a crystalline metal compound containing, by weight, at least 50% cobalt and at least 18% chromium.

By the expression "metal compound", it is necessary to understand a compound made up essentially of alloyed metals, while excluding their combination with oxygen, except in the form of traces that can result from the manufacturing process, but not knowingly sought.

The metal alloys based on cobalt, such as Alacrite®, are generally known for their exceptional resistance to corrosion (primarily due to the chromium), and their good wear resistance (primarily due to the cobalt). They are primarily used, in mechanics, for internally lining the bearings of pistons. Certain nuances are used in the medical field for the realization of implants and prostheses.

In a surprising manner, it was noted, during tests, that alloys containing a majority of cobalt and of chromium also presented ease of cleaning properties when such surfaces were used as cooking surfaces and foodstuffs remained attached to the surface, for example after a calcination of the products that were cooked. This ease of cleaning can be expressed by the possibility of easily removing carbonized, or burned, elements on the cooking surface.

Advantageously, the crystalline metal compound comprises at least 5% of one or more metals among: tungsten, nickel, molybdenum. The contribution of these materials mainly makes it possible particularly to increase hardness, which confers to the coating an increased resistance, particularly to mechanical shocks.

Preferably, the alloy comprises at least 60% cobalt, at least 25% chromium and at least 5% molybdenum.

According to a first embodiment of the invention, the food cooking surface for a kitchen utensil or cooking appliance is obtained by the deposition of a suitable thickness of the metallic material on a substrate. This deposition can be performed by various processes. One can cite in particular: thermal projection of a powder of an adequate granulometry, deposition by electrophoresis of a micron- or submicron-size powder, cathode sputtering of a massive target. In this last case the target can be obtained by assembly on a copper substrate of one or more sheets or material plates having the desired composition, the aforementioned sheets or plates being obtained either by powder sintering or thermal projection of powder, or resulting from casting. Generally, all the techniques of physical vapor phase deposition in can be used. Other techniques, such as hot compression or electrolytic deposition also can be used.

This embodiment has the advantage of using little material and of being able to adjust a small thickness of material on the substrate in order to produce the cooking surface.

All these techniques make it possible, in addition, to obtain deposits that strongly cohere with the substrate on which they are deposited. The risks of separation of the deposit during use are thus minimized.

According to a second embodiment of the invention, the food cooking surface for a kitchen utensil or cooking appliance is obtained by assembly of a crystalline metal sheet having the desired composition on a substrate. This embodiment has the advantage of being comparable to the known techniques for assembly of metals, which makes it possible to be able to adapt known techniques without significant specific development.

The assembly of the sheet on the substrate can be carried out by one of the following techniques: colaminage, brazing, hot striking, in a manner known per se. Explosion plating can also be considered.

Advantageously, the sheet and the substrate undergo, after assembly, a step of shaping by stamping. The substrate can be composed of one or more metal sheet(s) of the following materials: aluminum, stainless steel, cast iron, steel, copper.

Other advantages resulting from tests will appear from a reading of the description that will follow, in relation with an illustrative example of the present invention given by way of a nonlimiting example.

The example of realization of the invention relates to a deposition by PVD, of an alloy of the composition (by weight): 65% Co, 28% Cr, 5.5% Mo, the other elements being less than 1%, on stainless steel substrate. One surface of this deposit underwent a mechanical surface treatment, before the performance of tests, in order to make it similar to other cooking surfaces so that the tests for evaluating the ease of cleaning such a surface, in household cooking use, can be compared.

The system for evaluation of the ease of cleaning makes it possible to quantify the abilities of a cooking surface to return to its original appearance after use. This system for evaluation comprises the following steps:

the surface is locally covered with a food mixture of known composition,
this mixture is carbonized in an oven under defined conditions, for example at 210° C. for 20 minutes,
after cooling, surface is soaked for a controlled time in a mixture of water and detergent,
an abrasive pad is then applied with a defined force using an abrading apparatus (plynometer) to the soiled surface in a back and forth pass for a given number of cycles, the percentage of properly cleaned surface is noted and characterizes the ease of cleaning of the cooking surface.

Tests carried out on various types of surfaces thus make it possible to comparatively evaluate the quality of the surfaces as to their ease of cleaning.

Of course, the tests are carried out by respecting the same parameters for each step of the evaluation system: same food mixture, same application surface for the food mixture, same carbonization temperature. . . .

The following comparative table shows the results obtained on three different cooking surfaces, namely polished stainless steel, quasi-crystals, and the cobalt/chromium alloy on stainless steel, as previously described, after polishing, in a severe test with a food composition based on milk and rice considered difficult to clean once carbonized, or burned. Such a test thus makes it possible to clearly highlight the differences between the quality of cleaning of the surfaces.

|  | Polished stainless steel | Quasi-crystals | Polished Co/Cr alloy on stainless steel |
|---|---|---|---|
| Quantity of burned residue removed | 50% | 60% | 90% |

The table shows without ambiguity the very interesting results obtained with the Co/Cr alloy deposited on stainless steel, and in particular the results compared with other cooking surfaces. Other tests conducted on a stainless steel base show similar results.

It is to be noted that the number of abrasion cycles on the plynometer was fixed at 18. This reduced number of cycles highlights well the quality of ease of cleaning of the surface according to the invention since no more than 10% of the surface remains soiled after 18 back and forth movements of the abrasive pad.

Repetitive tests after complete cleaning of the surface show that the ease of cleaning of the alloy presented is not changed.

When the implementation of the invention implies the use of a substrate, this is then composed of one or more metal sheet(s) of the following materials: aluminum, stainless steel, cast iron, steel, copper.

The invention claimed is:

1. A method for cooking food comprising:
   producing a kitchen utensil or cooking appliance by;
   providing a kitchen utensil or cooking appliance body composed at least partially of a metal substrate; and
   securing a layer or sheet of a metal compound containing, by weight, at least 50% cobalt and at least 18% chromium to a surface of the substrate in order to form a cooking surface composed of the metal compound that is easy to clean;
   heating the kitchen utensil or cooking appliance and placing food on the cooking surface; and
   removing the food from the utensil or appliance after cooking of the food has been completed.

2. The method of claim 1, wherein said step of securing comprises depositing a layer of the metal compound on the surface of the substrate.

3. The method of claim 2, wherein said step of depositing is carried out by cathode sputtering of a massive target.

4. The method of claim 3, wherein the target is obtained by assembly on a copper substrate of one or more sheets or material plates having the sought composition, said sheets or plates being obtained either by powder sintering or thermal powder projection, or resulting from casting.

5. The method of claim 1, wherein said step of securing is carried out by one of the following techniques: colaminage, brazing, hot striking.

* * * * *